(12) United States Patent
Kim

(10) Patent No.: US 11,757,464 B2
(45) Date of Patent: Sep. 12, 2023

(54) ANALOG-TO-DIGITAL CONVERSION APPARATUS AND CAMERA DEVICE INCLUDING THE SAME

(71) Applicant: SAMSUNG ELECTRO-MECHANICS CO., LTD., Suwon-si (KR)

(72) Inventor: Gyu Won Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/836,218

(22) Filed: Jun. 9, 2022

(65) Prior Publication Data

US 2023/0046846 A1 Feb. 16, 2023

(30) Foreign Application Priority Data

Aug. 13, 2021 (KR) .................. 10-2021-0107438

(51) Int. Cl.
*H03M 3/00* (2006.01)
*H03M 1/12* (2006.01)
*H04N 23/67* (2023.01)
*H04N 23/68* (2023.01)

(52) U.S. Cl.
CPC .......... *H03M 1/1265* (2013.01); *H03M 3/30* (2013.01); *H04N 23/67* (2023.01); *H04N 23/687* (2023.01); *H03M 1/12* (2013.01)

(58) Field of Classification Search
CPC ........ H03M 1/1265; H03M 3/30; H03M 1/12; H04N 23/67; H04N 23/687
See application file for complete search history.

(56) References Cited

U.S. PATENT DOCUMENTS

| | | |
|---|---|---|
| 5,663,729 A | 9/1997 | Wada et al. |
| 2012/0194367 A1 | 8/2012 | Wang |
| 2018/0234103 A1 | 8/2018 | Barrenscheen et al. |
| 2019/0086633 A1 | 3/2019 | Kim et al. |

FOREIGN PATENT DOCUMENTS

| | | | | |
|---|---|---|---|---|
| JP | 8-95710 A | | 4/1996 | |
| JP | 2004157770 A | * | 6/2004 | ............... G06F 3/05 |
| JP | 2018-133803 A | | 8/2018 | |
| JP | 2020-513539 A | | 5/2020 | |
| KR | 10-1999-0066052 A | | 8/1999 | |
| KR | 10-2001-0028503 A | | 4/2001 | |
| KR | 10-2012-0088603 A | | 8/2012 | |
| KR | 10-2019-0033132 A | | 3/2019 | |
| WO | WO 2018/081481 A1 | | 5/2018 | |

OTHER PUBLICATIONS

Korean Office Action dated Feb. 27, 2023, in Counterpart Korean Patent Application No. 10-2021-0107438 (4 Pages in English, 4 Pages in Korean).

* cited by examiner

*Primary Examiner* — Joseph J Lauture
(74) *Attorney, Agent, or Firm* — NSIP Law

(57) ABSTRACT

An analog-to-digital conversion apparatus is provided. The analog-to-digital conversion apparatus includes an integrated circuit (IC) configured to generate a first interrupt request; and an analog-to-digital converter included in an integrated circuit, wherein the analog-to-digital converter is configured to receive a plurality of analog values from a plurality of channels, and convert at least a portion of the received analog values that correspond to at least a portion of channels of the plurality of channels, that are selected based on the first interrupt request into at least a portion of digital values.

16 Claims, 13 Drawing Sheets

ANALOG-TO-DIGITAL CONVERSION APPARATUS AND CAMERA DEVICE INCLUDING THE SAME

CROSS-REFERENCE TO RELATED APPLICATIONS

This application claims the benefit under 35 USC § 119(a) of Korean Patent Application No. 10-2021-0107438, filed on Aug. 13, 2021, in the Korean Intellectual Property Office, the entire disclosure of which is incorporated herein by reference for all purposes.

BACKGROUND

1. Field

The following description relates to an analog-to-digital conversion apparatus and a camera device including the same.

2. Description of Related Art

Typically, an electronic device may include a component, a position of which needs to be controlled, such as a camera module or device, and a position of a lens module that may be included in the camera module or device may be controlled through a driving signal for the component. A camera module driving apparatus that may be included in the camera module may receive position and/or acceleration information of the component, may calculate a value for accurately driving the component according to a control logic (optical image stabilization (OIS) and/or autofocusing (AF) control) based on the position and/or acceleration information, and may drive the component based on the value. Since the position and/or acceleration information of the component may be collected as an analog value, an analog-to-digital converter may convert an analog value to a digital value, and the camera module driving apparatus may drive the camera module based on the digital value.

Recently, as the optical magnification of a lens in the camera module increases, and a barrel of the lens module in the camera module becomes longer, a sensing range of a position and/or an acceleration of the lens module may be increased, and the number of sensors to sense the position and/or the acceleration may increase. Accordingly, timing control of the analog-to-digital converter may be complicated, and the number of analog-to-digital converters may increase.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an analog-to-digital conversion apparatus includes an integrated circuit (IC) configured to generate a first interrupt request; and an analog-to-digital converter comprised in the integrated circuit, wherein the analog-to-digital converter is configured to: receive a plurality of analog values from a plurality of channels, and convert at least a portion of the received analog values that correspond to at least a portion of channels of the plurality of channels, that are selected based on the first interrupt request into at least a first portion of digital values.

A correspondence relationship between the first interrupt request and the at least a portion of channels may be variable.

The IC may be further configured to generate a second interrupt request, the analog-to-digital converter may be configured to convert at least a portion of analog values corresponding to at least a portion of channels selected based on the second interrupt request among the plurality of channels into at least a second portion of digital values, and at least a portion of the at least a portion of channels selected based on the second interrupt request may be different from the at least a portion of channels selected based on the first interrupt request.

The analog-to-digital converter may be configured to perform a first analog-to-digital conversion operation for the at least a portion of channels selected based on the first interrupt request, and may be configured to perform a second analog-to-digital conversion operation for the at least a portion of channels selected based on the second interrupt request in a time division operation.

The apparatus may include a register including a first register configured to store digital values based on a first analog-to-digital conversion operation for the at least a portion of channels selected based on the first interrupt request, and a second register configured to store digital values based on a second analog-to-digital conversion operation for the at least a portion of channels selected based on the second interrupt request.

The at least a portion of channels selected based on the first interrupt request and the at least a portion of channels selected based on the second interrupt request may be partially the same as each other.

A number of the at least a portion of channels selected based on the first interrupt request and a number of the at least a portion of channels selected based on the second interrupt request may be different from each other, and a time between the first interrupt request and the second interrupt request may be different from a time between the second interrupt request and a third interrupt request.

The apparatus may include a timer configured to generate the first interrupt request by applying a first load value, and configured to generate the second interrupt request by applying a second load value.

The analog-to-digital converter may include an analog to digital converter (ADC) modulator configured to convert the received analog values into the digital values based on a sampling clock; and an ADC controller configured to determine whether or not the analog-to-digital converter is in an enable state based on the first interrupt request, and control the ADC modulator based on a change point in time of the enable state.

The ADC controller may be configured to control a conversion timing of the ADC modulator based on a start of conversion (SOC) time having an analog-to-digital conversion period that is based on the first interrupt request, and the start of conversion (SOC) time is synchronized with the change point in time of the enable state.

The analog-to-digital converter may include an analog to digital converter (ADC) modulator configured to convert the analog values into the digital values based on a sampling clock; and an ADC controller configured to control a conversion timing of the ADC modulator based on a start of conversion (SOC) time having an analog-to-digital conversion period based on the first interrupt request.

The analog-to-digital converter may include an analog to digital converter (ADC) modulator configured to convert the analog values into the digital values based on a sampling clock; and an ADC controller configured to generate a reset signal per analog-to-digital conversion for each of the at least a portion of channels selected based on the first interrupt request, wherein a width between a plurality of points in time at which a value is changed in the reset signal may be variable based on the at least a portion of channels selected based on the first interrupt request.

The analog-to-digital converter may be configured to store digital values based on analog-to-digital conversion in a register, and generate a data received interrupt request so that one of an external component of the analog-to-digital converter and a driver receives the digital values stored in the register, and a frequency of the generation of the data received interrupt request may be determined based on the at least a portion of channels selected based on the first interrupt request among the plurality of channels.

The plurality of channels may include a plurality of Hall sensors.

The apparatus may include a driver comprised in the IC, and configured to generate a driving signal based on the digital value converted by the analog-to-digital converter, wherein the analog-to-digital converter and the driver may be configured to be synchronized with each other based on the first interrupt request.

A device includes the IC including the analog-to-digital conversion apparatus of claim 1 and configured to generate a driving signal based on the digital values converted by the analog-to-digital converter; and a lens module, a position of which is controlled based on the generated driving signal, wherein the plurality of channels may be configured to generate the plurality of analog values based on the position of the lens module.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
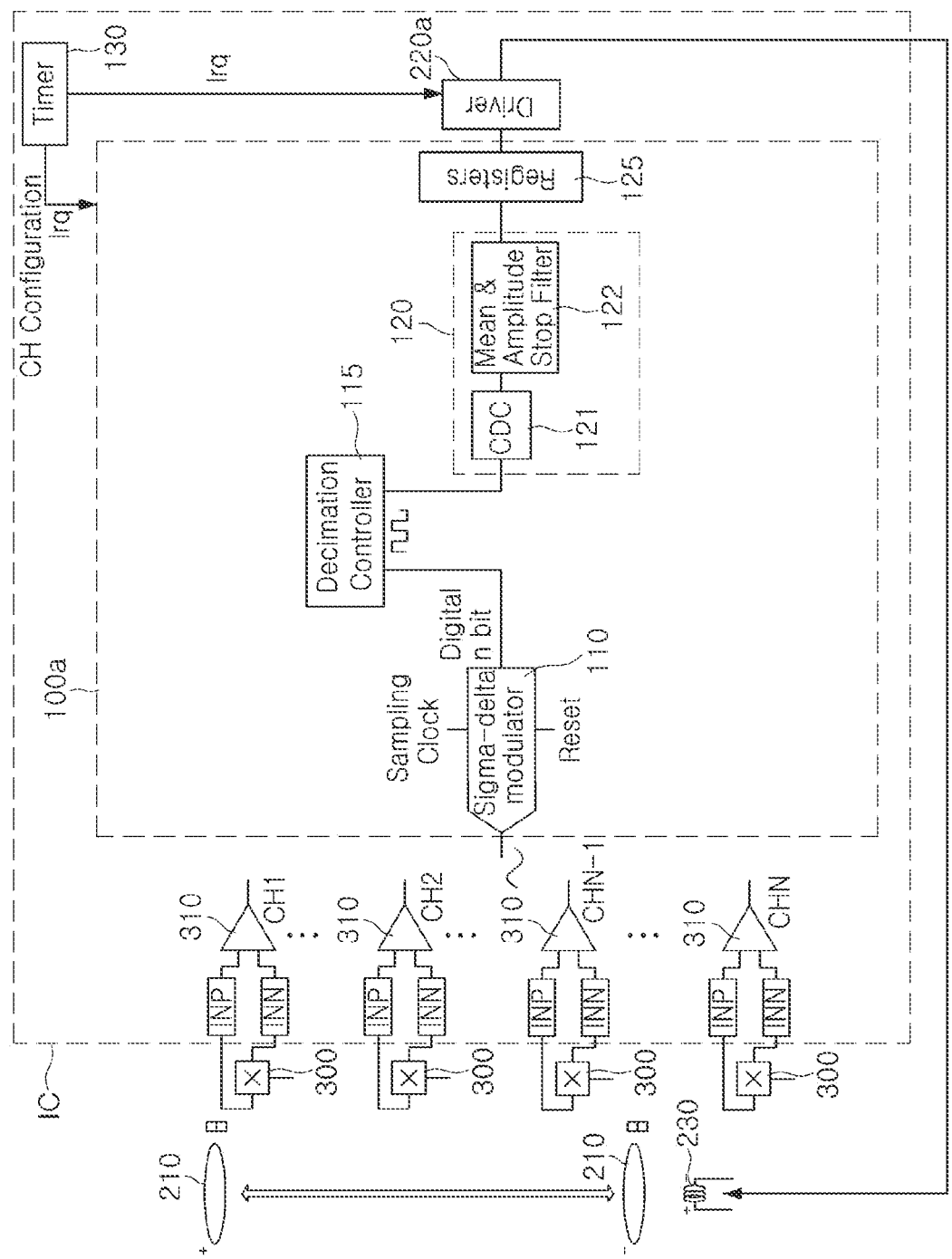
FIGS. 1A, 1B, and 1C are diagrams illustrating various example manners of a selected channel configuration based on an interrupt request of an example analog-to-digital conversion apparatus, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

In addition, terms such as first, second, A, B, (a), (b), and the like may be used herein to describe components. Each of these terminologies is not used to define an essence, order, or sequence of a corresponding component but used merely to distinguish the corresponding component from other component(s).

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

Figure 1B:
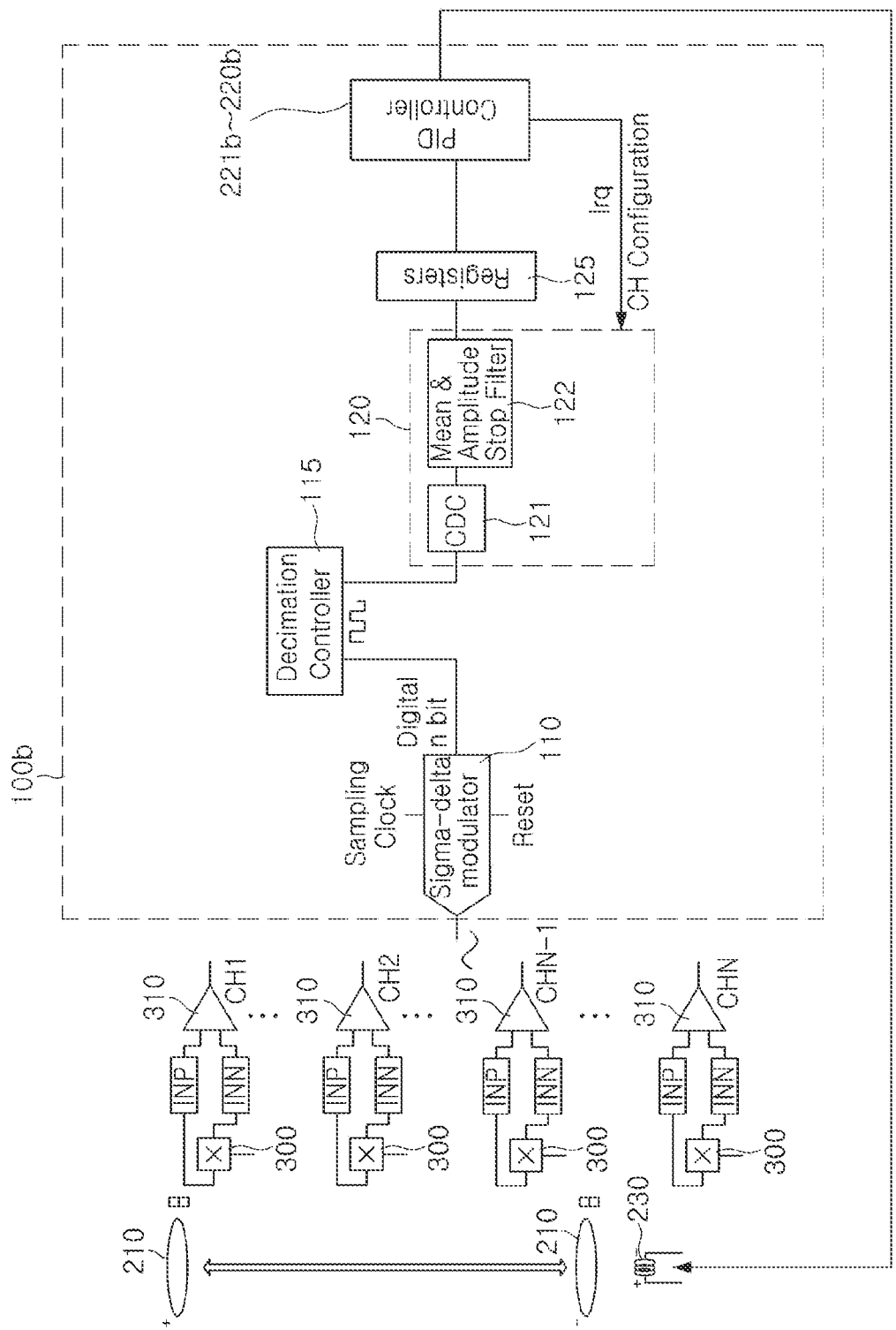
Figure 1C:
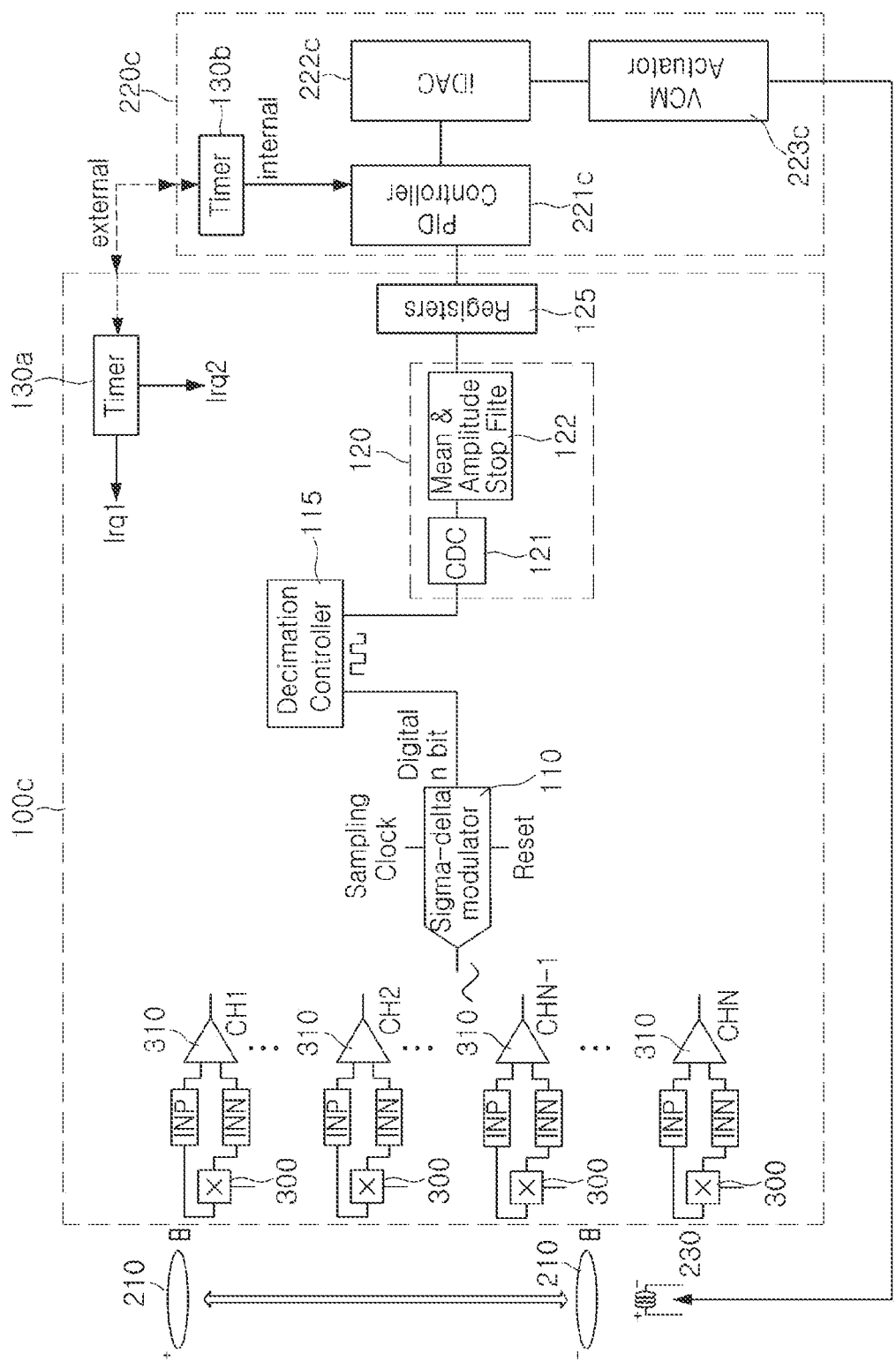

FIGS. 1A, 1B, and 1C are diagrams illustrating various examples of a selected channel configuration based on an interrupt request of an example analog-to-digital conversion apparatus, in accordance with one or more embodiments.

Referring to FIG. 1A, an example analog-to-digital conversion apparatus, in accordance with one or more embodiments, may include an analog-to-digital converter 100a included in an integrated circuit (IC), and, in an example, a camera device, in accordance with one or more embodiments, may include the IC and a lens module 210.

The analog-to-digital converter 100a may receive a plurality of analog values from the plurality of channels CH1, CH2, . . . , CHN−1, and CHN. In an example, the plurality of channels CH1, CH2, . . . , CHN−1, and CHN may be a plurality of Hall sensors 300.

The plurality of Hall sensors 300 may sense a position of the lens module 210. As the number of Hall sensors 300 increases, a position sensing range and/or position sensing resolution of the lens module 210 may be further increased. In an example, the plurality of Hall sensors 300 may be disposed in an aperture of a coil form of a voice coil motor (VCM) 230, and the IC may also be disposed in the aperture.

In an example, the IC may include a plurality of amplifiers 310, and each of the plurality of amplifiers 310 may amplify a voltage difference between a positive terminal INP and a negative terminal INN of a corresponding Hall sensor of the plurality of Hall sensors 300. The analog-to-digital converter 100a may receive voltage differences each corresponding to the plurality of amplifiers 310.

The analog-to-digital converter 100a may sequentially convert at least a portion of the plurality of analog values received from the plurality of channels CH1, CH2, . . . , CHN−1, and CHN into at least a portion of digital values, and the number (e.g., one) of analog-to-digital converters 100a may thus be less than the number (e.g., N) of channels CH1, CH2, . . . , CHN−1, and CHN.

The greater the difference between the number (e.g., one) of analog-to-digital converters 100a and the number (e.g., N) of channels CH1, CH2, . . . , CHN−1, and CHN, the longer the total analog-to-digital conversion time of the analog-to-digital converter 100a. The longer the total analog-to-digital conversion time of the analog-to-digital converter 100a, the longer the analog-to-digital conversion period of each of the plurality of channels CH1, CH2, . . . , CHN−1, and CHN.

A maximum analog-to-digital conversion period of each of the plurality of channels CH1, CH2, . . . , CHN−1, and CHN may be determined according to an external factor of the analog-to-digital conversion apparatus in accordance with one or more embodiments (e.g., characteristics of a target (e.g., a camera module) in which the analog-to-digital conversion apparatus is used, an analog-to-digital conversion time necessary for optical image stabilization (OIS) control and/or auto focus (AF) control of the camera module, etc.).

Therefore, the number (e.g., N) of channels CH1, CH2, . . . , CHN−1, and CHN linked per analog-to-digital converter 100a may be limited. Additionally, as the number (e.g., N) of channels CH1, CH2, . . . , CHN−1, and CHN increases, the analog-to-digital converter 100a may perform secondary adjustment (e.g., over a clock of a sampling clock or a decrease of a time difference between various timings) for decreasing the total analog-to-digital conversion time. However, the secondary adjustment may also have a limitation due to robustness of the analog-to-digital converter 100a against noise, a power consumption limitation, the necessity to secure safety, and the like.

Additionally, since the number (e.g., N) of channels CH1, CH2, . . . , CHN−1, and CHN linked to the analog-to-digital converter 100a may provide a plurality of analog values according to different factors (e.g., different positions of the plurality of Hall sensors 300), as the number (e.g., N) of channels CH1, CH2, . . . , CHN−1, and CHN linked to the analog-to-digital converter 100a is increased, the analog-to-digital converter 100a may perform analog-to-digital conversion on more analog values, and the total number of analog-to-digital converters 100a may be decreased, such that a size and/or a cost of the IC may be effectively decreased.

The analog-to-digital converter 100a of the example analog-to-digital conversion apparatus may efficiently select a channel on which analog-to-digital conversion is to be performed among the plurality of channels CH1, CH2, . . . , CHN−1, and CHN based on at least one interrupt request (Irq) that may be generated by the IC as channel configuration information (CH Configuration). In an example, the analog-to-digital converter 100a may select all of the plurality of channels CH1, CH2, . . . , CHN−1, and CHN or may select only some of the plurality of channels CH1, CH2, . . . , CHN−1, and CHN.

That is, the analog-to-digital converter 100a may convert at least a portion of analog values corresponding to at least a portion of channels selected according to an interrupt request among the plurality of channels CH1, CH2, . . . , CHN−1, and CHN into at least a portion of digital values. In an example, the interrupt request may be an interrupt request of a timer 130 of the IC. The timer 130 may be provided in a process of manufacturing and implementing the IC, and a configuration of the interrupt request of the timer 130 may be appropriately processed by a user or a manufacturer.

In an example, the IC may receive selection information on each of the plurality of channels CH1, CH2, . . . , CHN−1, and CHN from the user or the manufacturer, the number of the selection information may be at least one, and may correspond to at least one interrupt request, the IC may store correspondence relationship information between the selection information and the interrupt request, and the correspondence relationship information may be shared with at least a portion of, (e.g., an ADC controller 120), of the analog-to-digital converter 100a. Thereafter, the IC may generate the corresponding interrupt request, such that the analog-to-digital converter 100a may perform an operation according to the correspondence relationship information.

In an example, since the selection information or the correspondence relationship information may be provided to the IC while the analog-to-digital converter 100a performs the analog-to-digital conversion, the selection information or the correspondence relationship information may be variable even while the analog-to-digital converter 100a performs the analog-to-digital conversion. That is, a correspondence relationship between at least a portion of channels selected according to the interrupt request and the interrupt request may be variable.

In an example, the analog-to-digital converter 100a may operate according to the interrupt request, and may thus be efficiently synchronized with the IC generating the interrupt request.

In an example, the analog-to-digital converter 100a may perform the analog-to-digital conversion based on a sampling clock, and may be synchronized with the IC even though the sampling clock is not synchronized with the interrupt request.

Accordingly, a main clock and a sampling clock of the IC may be asynchronous to each other, and thus, an influence of the main clock and the sampling clock on each other may be decreased.

In an example, the driver 220a may be included in the IC, may operate based on the main clock, and may generate a driving signal based on the digital value output from the analog-to-digital converter 100a, and noise related to control (e.g., proportional integral deviation (PID) control) of the driver 220a may be prevented from interfering in the sampling clock. That is, the analog-to-digital converter 100a and the driver 220a may be synchronized with each other based on the interrupt request of the IC, and may decrease unnecessary interference in each other while being synchronized with each other.

Accordingly, noise of each of the driver 220a and the analog-to-digital converter 100a may be decreased, and the analog-to-digital converter 100a may have high resolution based on the decrease in the noise. Additionally, since a timing configuration of the driver 220a and a timing configuration of the analog-to-digital converter 100a may be independent of each other, the timing configuration of the analog-to-digital converter 100a may become more sophisticated or accurate, and performance (e.g., a signal-to-noise ratio, a conversion speed, resolution, power consumption, reliability, etc.) of the analog-to-digital converter 100a may be further improved.

The analog-to-digital converter 100a and the driver 220a may be synchronized with each other based on the interrupt request of the IC. Accordingly, although the analog-to-digital converter 100a and the driver 220a may operate based on a plurality of different clocks, timing control of each of the analog-to-digital converter 100a and the driver 220a may become more sophisticated or accurate. Accordingly, performance (e.g., a signal-to-noise ratio, a conversion speed, resolution, power consumption, reliability, etc.) of the analog-to-digital converter 100a may be further improved.

In an example, the analog-to-digital converter 100a may include an ADC modulator or Sigma-Delta modulator 110 and an ADC controller 120.

The ADC modulator 110 may convert an analog value into a digital value (Digital n bit) based on the sampling clock. An analog-to-digital conversion operation of the ADC modulator 110 is not limited to a sigma-delta operation, and may be a sequential approximation operation or an operation of arranging digital values in parallel for each bit, and these operations may be carried out based on a sampling period (sampling clock).

In an example, the analog-to-digital converter 100a may further include a decimation controller 115, and may perform decimation filtering on values according to sigma-delta modulation.

The ADC controller 120 may determine whether or not the analog-to-digital converter 110a is in an enable state based on the interrupt request of the timer 130, and control the ADC modulator 110 based on a change point in time of the enable state. In an example, the ADC controller 120 may include a CDC 121 and/or a Mean & Amplitude Step Filter 122. The CDC 121 may perform timing and/or delay control of the ADC modulator 110, and the Mean & Amplitude Step Filter 122 may control the order or merging of the digital values of the plurality of channels CH1, CH2, ..., CHN−1, and CHN.

In an example, the analog-to-digital converter 100a may further include a register 125. The register 125 may sequentially store the digital values, and the driver 220a may sequentially fetch the stored digital values.

In an example, the driver 220a may perform a PID control operation based on the digital value (Digital n bit) and generate a driving signal based on the PID control operation. A period of the PID control operation may be determined based on a clock (e.g., the main clock of the IC) linked to the interrupt request of the timer 130. The driver 220a may generate a driving current corresponding to the driving signal based on the PID control operation, and output the driving current to the voice coil motor 230.

The lens module 210 may include a magnetic material (e.g., a permanent magnet or steel), and the magnetic material may provide an action/reaction action of a Lorentz force based on the driving current flowing through the voice coil motor 230 to the lens module 210. Accordingly, the lens module 210 may move based on the driving signal and/or the driving current of the driver 220a.

Referring to FIG. 1B, an analog-to-digital converter 100b may include a driver 220b, and the driver 220b may include a PID controller 221b.

In an example, the driver 220b may generate an interrupt request (Irq), the PID controller 221b may be linked to the interrupt request, and the ADC controller 120 may receive the interrupt request. In an example, the interrupt request may be used as channel configuration information (CH Configuration).

Figure 10:
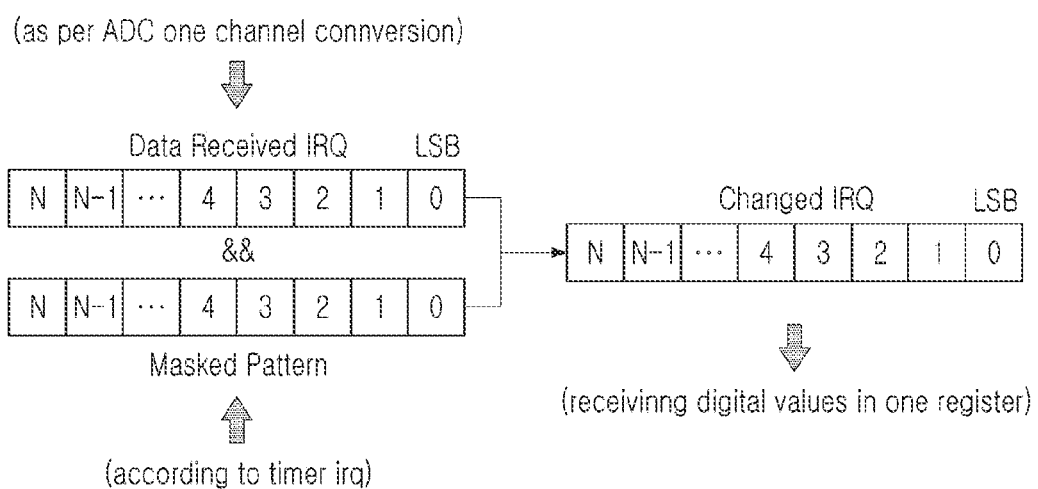
FIG. 10 illustrates an example of determining a frequency of generation of a data received interrupt request that may be generated in an example analog-to-digital conversion apparatus, in accordance with one or more embodiments according to an interrupt request of an example timer.

Referring to FIG. 10, a driver 220c may include a PID controller 221c, a digital-to-analog converter 222c, and a VCM actuator 223c, and may also include a timer 130b. That is, a timer 130a included in an analog-to-digital converter 100c and the timer 130b included in the driver 220c may be implemented separately from each other, and the timer 130a and the timer 130b may be synchronized with each other based on an interrupt request.

Additionally, still referring to FIG. 10, the timer 130a included in the analog-to-digital converter 100c may generate a plurality of interrupt requests Irq1 and Irq2. That is, the IC may generate not only an interrupt request Irq1 but also an additional interrupt request Irq2, and may thus generate multiple interrupt requests Irq.

The analog-to-digital converter 100c may convert at least a portion of analog values corresponding to at least a portion of channels selected according to the additional interrupt request Irq2 among the plurality of channels CH1, CH2, . . . , CHN−1, and CHN to at least a portion of digital values, and sequentially perform first analog-to-digital conversion for at least a portion of channels selected according to the interrupt request Irq1 and second analog-to-digital conversion for at least a portion of channels selected according to the additional interrupt request Irq2.

In an example, at least a portion of at least a portion of channels selected based on the additional interrupt request Irq2 may be different from at least a portion of channels selected based on the interrupt request Irq1, and at least a portion of channels selected based on the interrupt request Irq1 and at least a portion of channels selected based on the additional interrupt request Irq2 may be partially the same as each other. Each of the plurality of channels CH1, CH2, . . . , CHN−1, and CHN may not necessarily be selected according to only one of the interrupt request Irq1 and the additional interrupt request Irq2, and may be selected according to two or more interrupt requests or may not be selected.

Figure 1D:
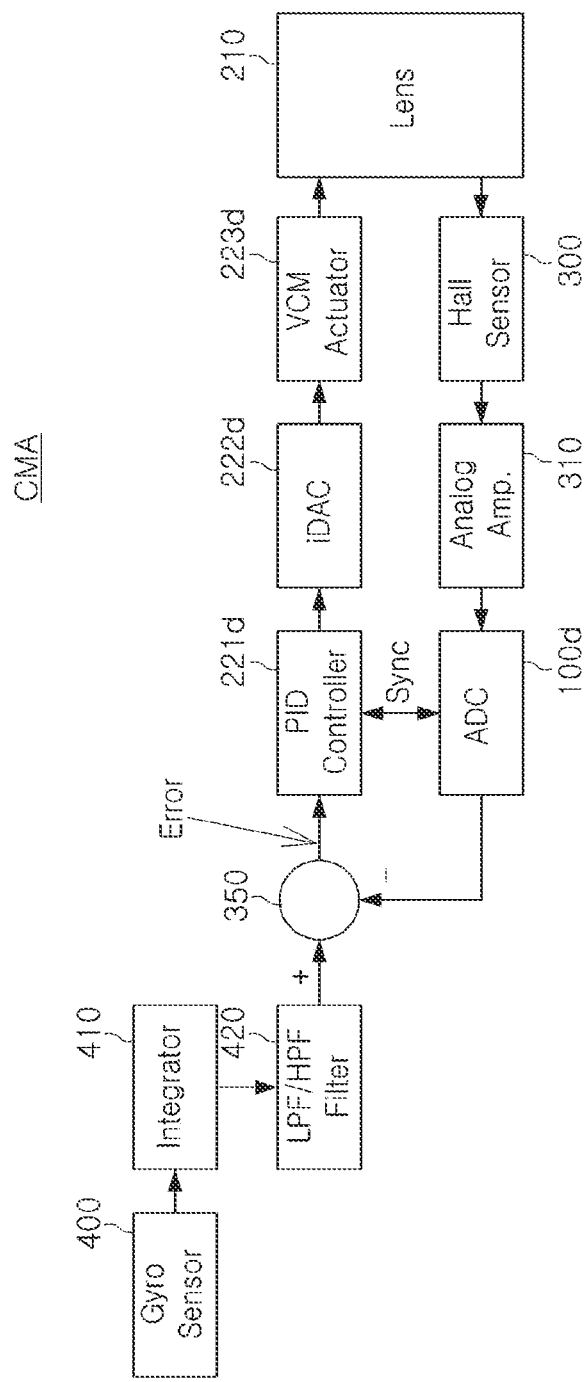
FIG. 1D is a block diagram illustrating an example optical image stabilization structure that may be included in an example analog-to-digital conversion apparatus, in accordance with one or more embodiments.

FIG. 1D is a block diagram illustrating an optical image stabilization structure that may be included in the analog-to-digital conversion apparatus, in accordance with one or more embodiments.

Optical image stabilization means that the clarity of an image obtained from an image sensor is secured even though a lens module moves by moving the lens module or the image sensor in an opposite direction to a first direction when the lens module moves in the first direction.

Referring to FIG. 1D, an example camera module CMA may include an analog-to-digital converter 100d and a lens module 210, convert analog values of a Hall sensor 300 and/or a gyro sensor 400 into digital values, and use the digital values to drive the lens module 210.

The gyro sensor 400 may detect an acceleration when the lens module moves due to an external environment (e.g., a handshake of a camera user), an integrator 410 may integrate the acceleration to convert the acceleration into a speed, and a filter 420 may control DC offset and/or high frequency (e.g., frequency exceeding 20 Hz) noise of the gyro sensor 400 and/or the integrator 410 and provide output information to a summer 350.

The analog-to-digital converter 100d may negatively feedback information corresponding to a position of the lens module 210 to the summer 350, a PID controller 221d may perform PID control based on a summation result of the summer 350 to generate information on a magnitude of a Lorentz force to be applied to the lens module 210, a digital-to-analog converter 222d may convert the information into an analog value, a VCM actuator 223d may generate a driving current corresponding to the analog value, and the lens module 210 may move based on the driving current.

On the other hand, the example analog-to-digital conversion apparatus may also be applied to auto focus (AF) control of the lens module 210, and the analog-to-digital converter 100d and a driver (corresponding to the PID controller 221d) may be applied to feedback and driving of an auto focus control structure.

As an optical magnification of the lens of the lens module 210 becomes higher, a barrel of the lens module 210 may become longer, and the number of Hall sensors 300 may be increased. As the number of Hall sensors 300 increases, timing control of the analog-to-digital converter 100d may become more complicated, and the number of clocks used by the analog-to-digital converter 100d may increase.

Since the example analog-to-digital conversion apparatus may convert a plurality of analog values provided from Hall sensors 300 selected according to the interrupt request of the IC among the plurality of Hall sensors 300 into digital values, the analog-to-digital conversion apparatus may more efficiently cope with an increase in sizes or improvement of performance of the lens module 210 and/or the Hall sensor 300, and may more efficiently cope with the increase in the number of Hall sensors 300.

Additionally, since the example analog-to-digital conversion apparatus may be efficiently synchronized to the IC based on the interrupt request of the IC, the analog-to-digital conversion apparatus may more efficiently cope with an increase in sizes or improvement of performance of the lens module 210 and/or the Hall sensor 300.

Figure 2A:
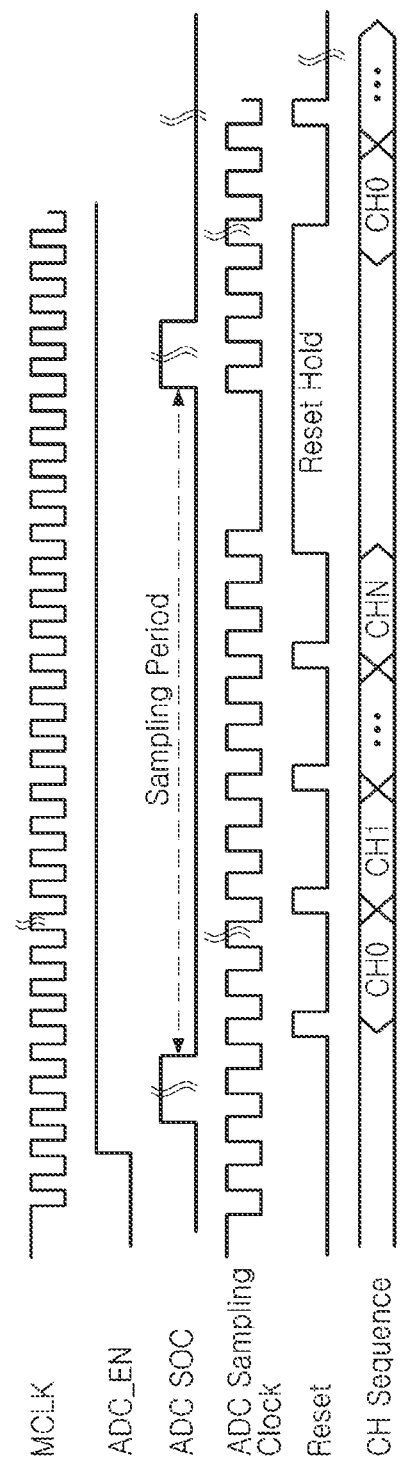
FIGS. 2A and 2B illustrate timing diagrams of various signals of an example analog-to-digital conversion apparatus, in accordance with one or more embodiments.
Figure 2B:
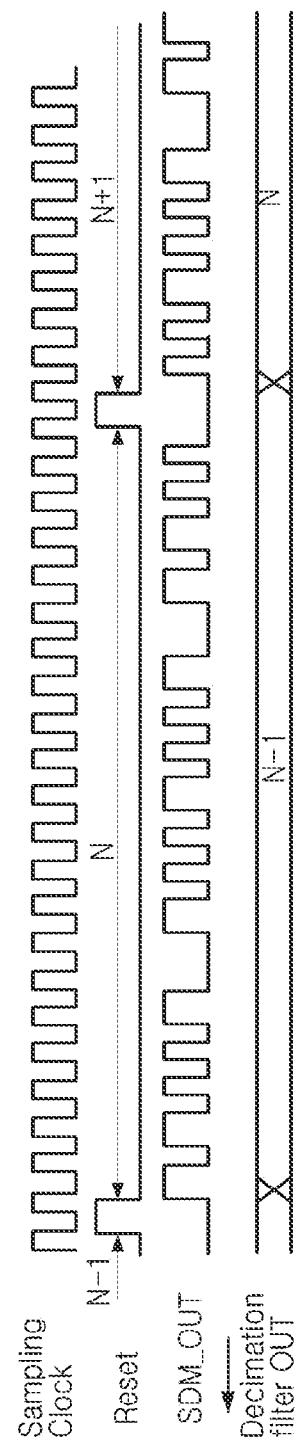

FIGS. 2A and 2B are timing diagrams of various signals of the analog-to-digital conversion apparatus, in accordance with one or more embodiments.

Referring to FIG. 2A, a sampling clock, "ADC Sampling Clock", that is provided to the analog-to-digital converter, and a main clock, "MCLK", of the IC may be different from each other. When the sampling clock, "ADC Sampling Clock", is provided to the analog-to-digital converter, the main clock, "MCLK", may be provided to the driver. A frequency difference and/or a phase difference between the sampling clock, "ADC Sampling Clock", and the main clock, "MCLK", may be variously determined based on a desired implementation.

Referring to FIG. 2A, the ADC controller may operate as an enable state when a value of a signal "ADC_EN" of an enable state is high, and may not operate when the value of the signal "ADC_EN" of the enable state is low, and may convert a unit analog value into a unit digital value per sampling period of a signal ADC SOC of a conversion start time. The sampling period may correspond to a total time needed for sequentially converting analog values of each of a plurality of channels CH0, CH1, . . . , CHN into digital values. The plurality of channels CH0, CH1, . . . , CHN may correspond to a plurality of Hall sensors, and the sampling period may increase as the number of channels CH0, CH1, . . . , CHN, increase and may thus be appropriately determined based on a desired time, resolution, power consumption, and the like.

The ADC controller may convert an analog value of one of the plurality of channels CH0, CH1, . . . CHN into a digital value per period of a reset signal "Reset", and the number of periods of the reset signal Reset corresponding to the sampling period may correspond to the number of channels CH0, CH1, . . . , CHN. The ADC controller may provide the reset signal Reset to the ADC modulator.

The reset signal "Reset" may have a reset hold of time after converting an analog value of the last channel CHN of the plurality of channels CH0, CH1, . . . , CHN to a digital value, and the reset hold may be linked to a value of the signal ADC SOC of the conversion start time.

Referring to FIG. 2B, the ADC modulator may output an output value SDM_OUT during an N-th period of a reset signal "Reset". The decimation controller illustrated in FIGS. 1A through 1O may filter the output value SDM_OUT of the ADC modulator and output an N-bit digital value Decimation filter OUT.

The N-bit digital value Decimation filter OUT may be stored in a storage space of a corresponding channel of the register illustrated in FIGS. 1A to 10. A correspondence relationship of channels in the register may be a channel sequence, and the channel sequence may be provided to the ADC controller and/or the ADC modulator.

Figure 3:
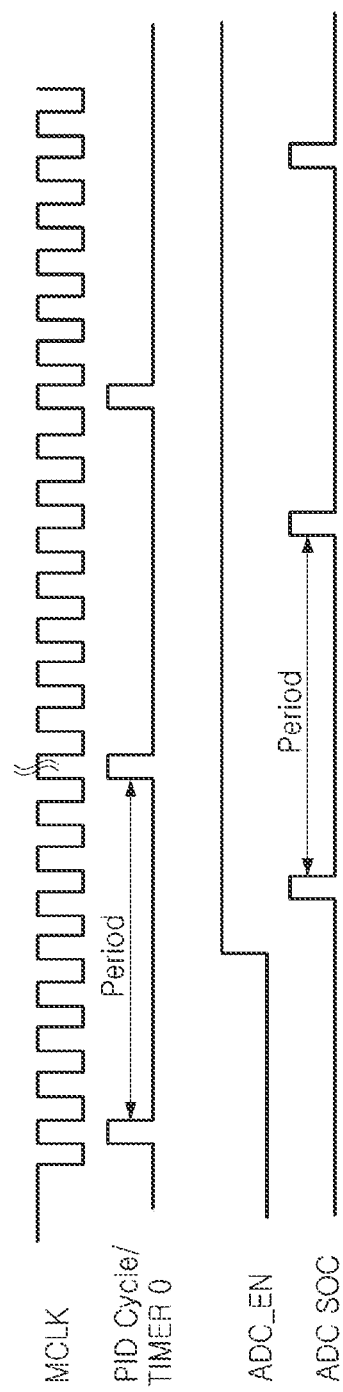
FIG. 3 illustrates an example timing diagram illustrating synchronization between a signal of an enable state of an example analog-to-digital converter and a signal of a start of conversion (SOC) time, in accordance with one or more embodiments.

FIG. 3 is a timing diagram illustrating synchronization between a signal "ADC_EN" of an enable state of an analog-to-digital converter and a signal "ADC_SOC" of a start of conversion (SOC) time.

Referring to FIG. 3, the signal "ADC_EN" of the enable state and the signal "ADC_SOC" of the start of conversion (SOC) time may be linked to each other, and a signal PID Cycle of a PID time of the driver may be linked to a timer TIMER 0 of the IC. The start of conversion (SOC) time may be synchronized with a change point in time of the enable state.

The signal "ADC SOC" itself of the start of conversion (SOC) time may be generated based on the sampling clock "ADC Sampling Clock" illustrated in FIG. 2A, and timing control of the signal "ADC SOC" of the start of conversion (SOC) time may be performed according to an interrupt request of the timer TIMER 0 of the IC, and thus, the analog-to-digital converter may be synchronized with the IC.

A period of the signal (PID Cycle) of the PID time and a period of the signal ADC SOC of the start of conversion (SOC) time may be linked to each other, and may be linked to each other based on the interrupt request of the timer TIMER 0 of the IC. Since a point in time of the provision of the interrupt request may be determined by the user, an operation point in time of the analog-to-digital converter may be flexibly determined.

Figure 4:
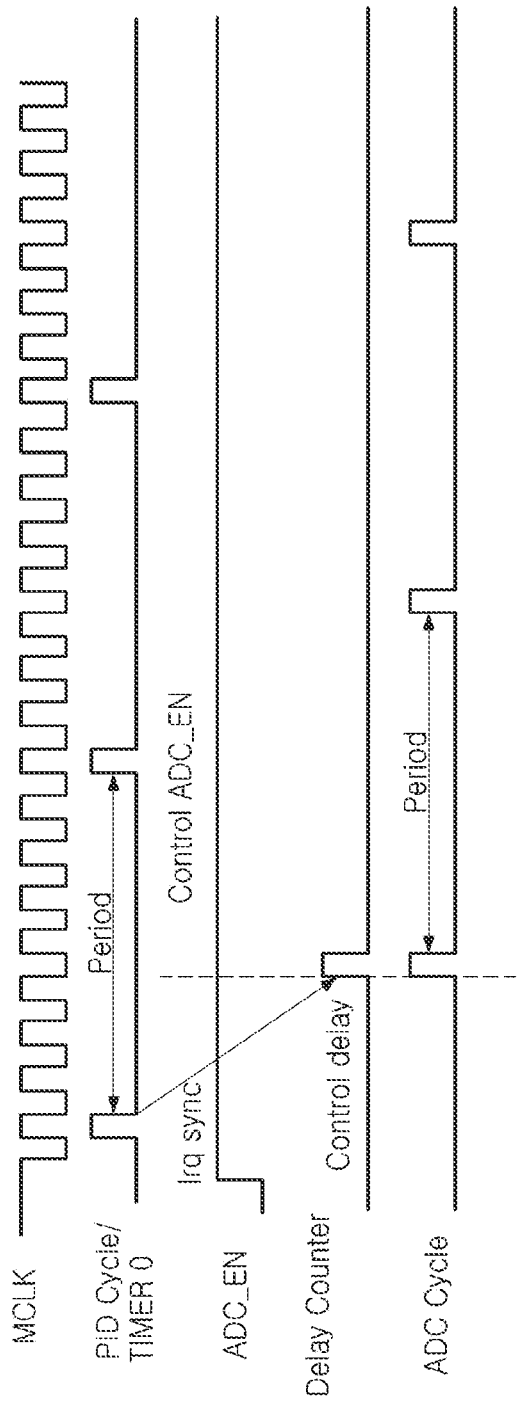
FIGS. 4 and 5 illustrate example timing diagrams illustrating the determination of a change point in time of the signal of the enable state of an example analog-to-digital converter based on an interrupt request, in accordance with one or more embodiments.
Figure 5:
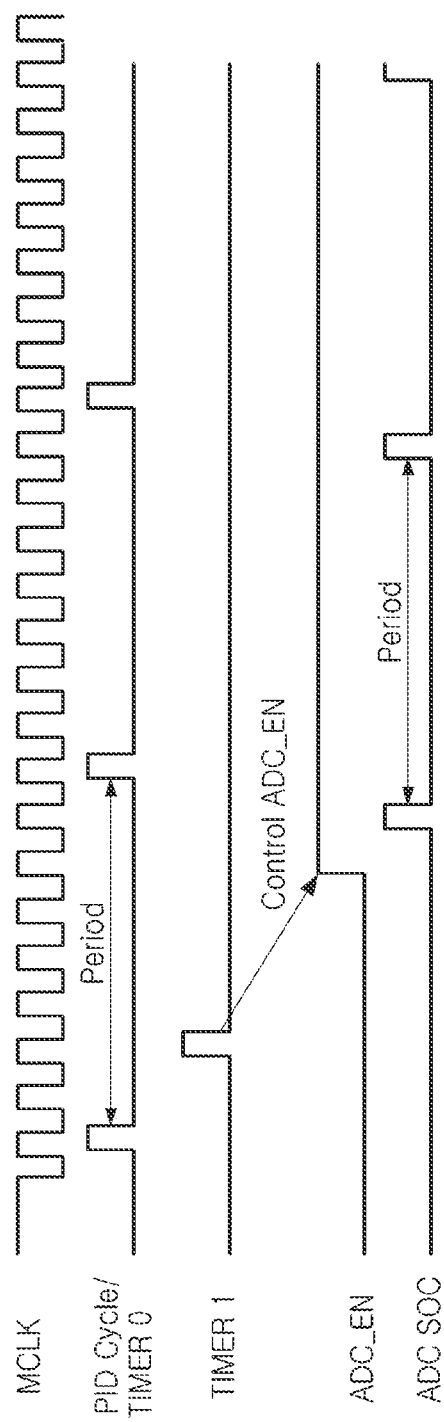

FIGS. 4 and 5 are timing diagrams illustrating determination of a change point in time of the signal ADC_EN of the enable state of the analog-to-digital converter based on an interrupt request.

Referring to FIG. 4, a cycle ADC Cycle of the analog-to-digital converter corresponding to the signal of the start of conversion (SOC) time, the timer TIMER 0 of the IC, and/or the signal PID Cycle of the PID time of the driver may be synchronized through the interrupt request (Irq sync).

In an example, the timer TIMER 0 of the IC and/or the signal PID Cycle of the PID time of the driver may be synchronized with a delay counter signal Delay Counter of the CDC illustrated in FIGS. 1A to 10 through the interrupt request, and the analog-to-digital converter may convert a unit analog value into a unit digital value per sampling period from a point in time determined based on a control delay of the delay counter signal Delay Counter.

Referring to FIG. 5, a timer TIMER 1 linked to the timer TIMER 0 of the IC and/or the signal PID Cycle of the PID time of the driver may be synchronized with the signal "ADC_EN" of the enable state through the interrupt request.

Since the signal "ADC_EN" of the enable state and the signal "ADC SOC" of the start of conversion (SOC) time may be synchronized with each other, the ADC controller may control the ADC modulator based on the change point in time of the enable state of the signal "ADC_EN" of the enable state.

Figure 6:
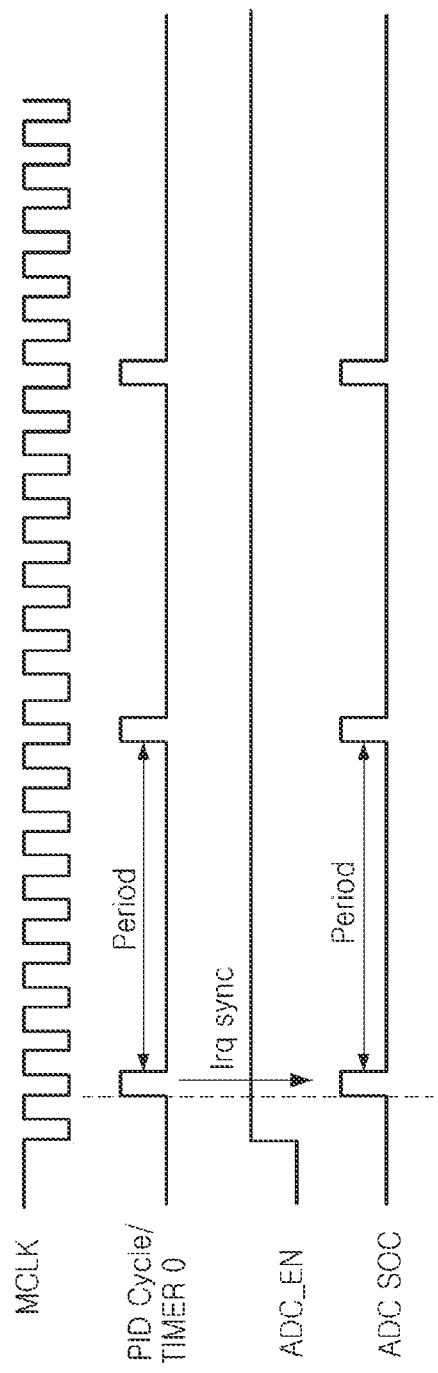
FIG. 6 illustrates a timing diagram illustrating that the interrupt request itself is used as a reference point of a signal of a conversion start time of an example analog-to-digital converter, in accordance with one or more embodiments.

FIG. 6 is a timing diagram illustrating that the interrupt request itself may be used as a reference point of a signal "ADC_SOC" of a conversion start time of the analog-to-digital converter.

Referring to FIG. 6, the timer TIMER 0 of the IC and/or the signal PID Cycle of the PID time of the driver and the signal "ADC SOC" of the start of conversion (SOC) time may be synchronized together with the main clock "MCLK" through the interrupt request.

That is, a reference time of the signal "ADC SOC" of the start of conversion (SOC) time may be determined according to a point in time when the ADC controller receives the interrupt request, and the interrupt request may directly trigger the signal "ADC SOC" of the start of conversion (SOC) time. Accordingly, the analog-to-digital converter may be more perfectly synchronized.

Figure 7:
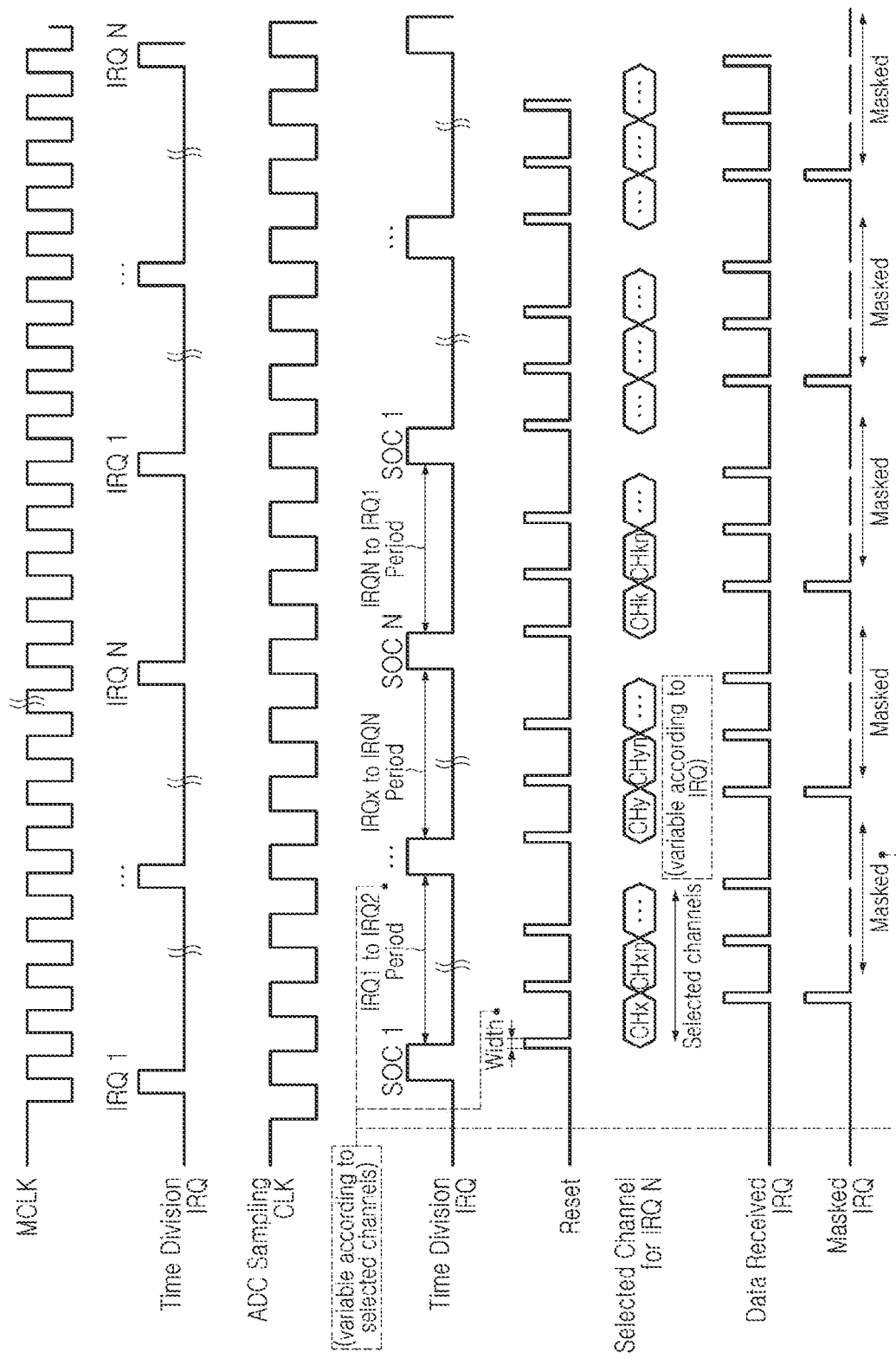
FIG. 7 illustrates a timing diagram illustrating those determined according to selected channels based on the interrupt request of an example analog-to-digital conversion apparatus, in accordance with one or more embodiments.

FIG. 7 is a timing diagram illustrating timings determined according to selected channels based on the interrupt request of the analog-to-digital conversion apparatus, in accordance with one or more embodiments.

Referring to FIG. 7, the analog-to-digital converter may perform first analog-to-digital conversion for at least a portion of channels CHx and CHxn selected according to an interrupt request IRQ 1 and second analog-to-digital conversion for at least a portion of channels CHy and CHyn selected according to an additional interrupt request IRQ 2 in a time division manner. The number of interrupt requests may be N, and the analog-to-digital converter may perform N-th analog-to-digital conversion for at least a portion of channels CHk and CHkn selected according to an N-th interrupt request IRQ N.

Accordingly, the number of times (e.g., 0 times, once, or N times) analog-to-digital conversion is performed for each of a plurality of channels during a cycle during total periods from a period of the interrupt request IRQ 1 to a period of the N-th interrupt request IRQ N may be efficiently set, and the analog-to-digital converter may stably perform timing control in various situations based on a determination of whether or not the analog-to-digital conversion for each of the plurality of channels should be performed, based on a plurality of interrupt requests IRQ 1, IRQ 2, . . . , IRQ N.

In an example, the number of at least a portion of channels selected based on the interrupt request IRQ 1 and the number of at least a portion of channels selected based on the additional interrupt request IRQ 2 may be different from each other. Since each of a time (IRQ 1 to IRQ 2 Period) between the interrupt request IRQ 1 and the additional interrupt request IRQ 2 and a time (IRQx to IRQN Period) between the additional interrupt request IRQ 2 and the next interrupt request (e.g. IRQ N and N is 3) may be proportional to the number of corresponding selected channels, the time (IRQ 1 to IRQ 2 Period) between the interrupt request IRQ 1 and the additional interrupt request IRQ 2 and the time (IRQx to IRQN Period) between the additional interrupt request IRQ 2 and the next interrupt request (e.g. IRQ N and N is 3) may be different from each other according to a difference between the selected channels.

In an example, since a period of signals SOC 1 and SOC N of the start of conversion (SOC) time may be dependent on a period (IRQ 1 to IRQ 2 Period) of the interrupt request, the period of the signals SOC 1 and SOC N of the start of conversion (SOC) time may be determined according to the selected channels. Accordingly, the ADC controller may control a conversion timing of the ADC modulator based on the start of conversion (SOC) time having an analog-to-digital conversion period according to the interrupt request.

In an example, a width between a plurality of points in time at which a value is changed in the reset signal Reset may be variable according to the channels selected based on the interrupt request. As a width of the reset signal Reset increases, noise in a switching process of analog-to-digital conversion within the selected channels may decrease, but the period of signals SOC 1 and SOC N of the start of conversion (SOC) time may become longer. Accordingly, the width of the reset signal Reset may be optimized, and an optimum point of the width may vary depending on the number of selected channels. The example analog-to-digital converter of the example analog-to-digital conversion apparatus may decrease noise and decrease the period of the signals SOC 1 and SOC N of the start of conversion (SOC) time, by varying the width of the reset signal Reset according to the channels selected according to the interrupt request.

In an example, the analog-to-digital converter may generate a data received interrupt request, "Data Received IRQ", so that an external component (e.g., a microprocessor) of the analog-to-digital converter or the driver may receive the digital values stored in the register. Since a typical analog-to-digital converter may generate a data received interrupt request, "Data Received IRQ", according to analog-to-digital conversion for one channel, the data received interrupt request, "Data Received IRQ", may be generated in the example analog-to-digital conversion apparatus as analog-to-digital conversion of each of the selected channels is completed, and the analog-to-digital conversion apparatus may decrease a frequency of generation of the data received interrupt request "Data Received IRQ" by applying a masked pattern to the data received interrupt request "Data Received IRQ" as a multiplication operation. Accordingly, the external component of the analog-to-digital converter or the driver may efficiently fetch the digital values stored in the register.

In an example, the frequency of the generation of the data received interrupt request, "Data Received IRQ" may be determined based on the selected channels. In an example, a data received interrupt request "Masked IRQ" to which the masked pattern is applied may be generated once per period of one interrupt request.

Figure 8:
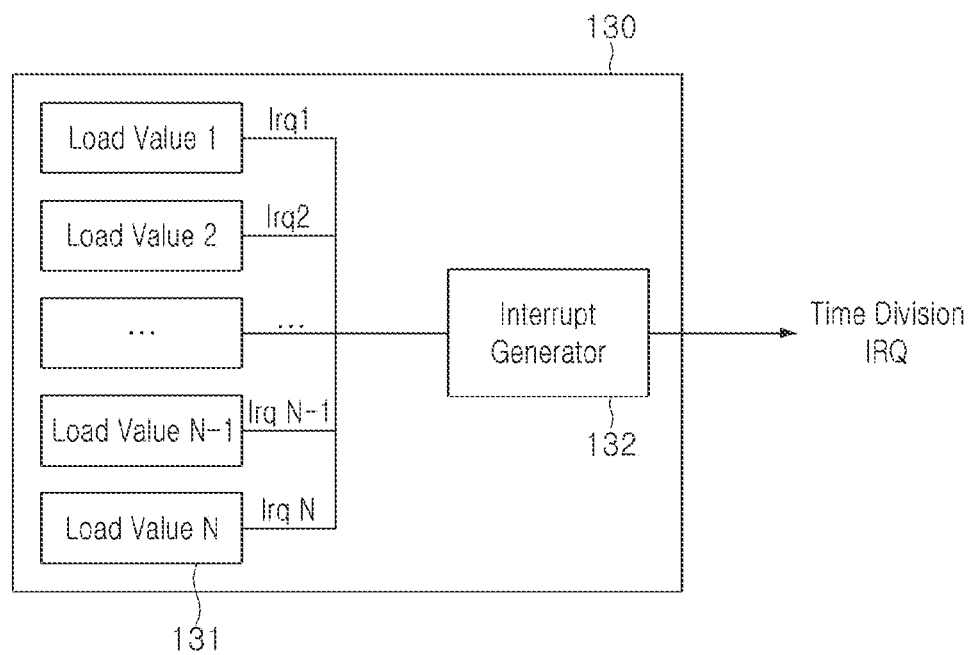
FIG. 8 illustrates an example timer generating an interrupt request of an example analog-to-digital conversion apparatus, in accordance with one or more embodiments.

FIG. 8 is a diagram illustrating a timer generating an interrupt request of the analog-to-digital conversion apparatus according to an exemplary embodiment in the present disclosure.

Referring to FIG. 8, the example analog-to-digital conversion may further include a timer 130 that generates a first interrupt request Irq1 by applying a first load value Load Value 1 and generating an additional or second interrupt request Irq2 by applying a second load value Load Value 2. Accordingly, the timer 130 may efficiently generate a plurality of interrupt requests Irq1, Irq2, . . . , Irq N even with one main clock, and may generate a plurality of interrupt requests Irq1, Irq2, . . . , Irq N based on time division. The timer 130 may generate an N-th interrupt request Irq N to which an N-th load value 131 is applied. A period of the N-th interrupt request Irq N may be determined according to the N-th load value 131.

An interrupt generator 132 of the timer 130 may perform signal processing (e.g., value change timing/size control) for each of the plurality of interrupt requests Irq1, Irq2, . . . , Irq N, and may be used as a common output terminal of the plurality of interrupt requests Irq1, Irq2, Irq N. Accordingly, one timer 130 may efficiently generate the plurality of interrupt requests Irq1, Irq2, Irq N.

Figure 9:
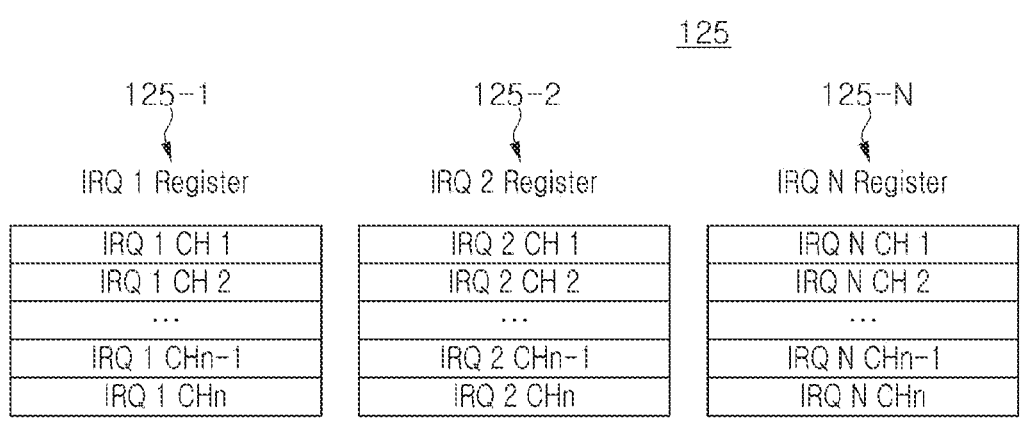
FIG. 9 illustrates an example register that may be included in an example analog-to-digital conversion apparatus, in accordance with one or more embodiments, and a plurality of registers included in the register.

FIG. 9 is a diagram illustrating a register that may be included in the analog-to-digital conversion apparatus, in accordance with one or more embodiments, and a plurality of registers included in the register.

Referring to FIG. 9, the example analog-to-digital conversion apparatus may include a register 125 including at least one of a first register 125-1, a second register 125-2, and an N-th register 125-N.

The first register 125-1 may store digital values based on the first analog-to-digital conversion for at least a portion of channels selected according to the interrupt request IRQ 1, the second register 125-2 may store digital values based on the second analog-to-digital conversion for at least a portion of channels selected according to the additional interrupt request IRQ 2, and the N-th register 125-N may store digital values based on the N-th analog-to-digital conversion for at least a portion of channels selected according to the N-th interrupt request IRQ N.

In an example, each of the first register 125-1, the second register 125-2, and the N-th register 125-N may have an initial storage space corresponding to the total number of channels CH1, CH2, . . . , CHN−1, and CHN, and may activate a portion of the initial storage space according to the selection information on the plurality of channels CH1, CH2, . . . , CHN−1, and CHN, and the activated storage space may storage digital values converted by the analog-to-digital converter.

Accordingly, channel selection information or channel order information of the first register 125-1, the second register 125-2, and the N-th register 125-N may be independent of each other. In an example, the first register 125-1 may store digital values corresponding to channels CH1 and CHN, the second register 125-2 may store digital values corresponding to the channels CH1 and CH2, the N-th register 125-N may store a digital value corresponding to the channel CH2, the first analog-to-digital conversion may be performed in the order of the channels CHN and CH1, and the second analog-to-digital conversion may be performed in the order of the channels CH1 and CH2.

FIG. 10 is a diagram illustrating an example of determining a frequency of generation of a data received interrupt request that may be generated in the example analog-to-digital conversion apparatus according to an interrupt request of a timer.

Referring to FIGS. 7 and 10, the data received interrupt request "Data Received IRQ" may be generated per analog-to-digital conversion for one channel, the masked pattern may be determined according to the interrupt request of the timer, and a data received interrupt request "Changed IRQ" to which the masked pattern is applied may be used for the external component or the driver to receive a digital value stored in the register.

In an example, when the remaining bits except for the least significant bit (LSB) in the masked pattern are 0, the remaining bits except for the LSB in the data received interrupt request "Changed IRQ" to which the masked pattern is applied may be 0, and the external component or the driver may perform a data reception operation according to the generated data received interrupt request only at a point in time corresponding to the LSB, and may fetch the digital values generated according to the analog-to-digital conversion for the selected channel from the register.

As set forth above, the example analog-to-digital conversion apparatus, in accordance with one or more embodiments, may efficiently select whether or not to perform analog-to-digital conversion for each of a plurality of analog values input from a plurality of channels of which the number of channels is more than the number of analog-to-digital converters, or may provide an efficient synchronization environment between an analog-to-digital convert linked to the plurality of channels and the IC (or the driver).

Accordingly, the example analog-to-digital conversion apparatus may perform analog-to-digital conversion for analog values more than the number of analog-to-digital converters, or may efficiently decrease a size and/or a cost of the IC according to a decrease in the total number of analog-to-digital converters. Alternately, the analog-to-digital conversion apparatus may decrease noise due to efficient synchronization, or may have high resolution due to the decrease in the noise, or a timing configuration/control may become more sophisticated or accurate, and thus, overall performance (e.g., a signal-to-noise ratio, a conversion speed, resolution, power consumption, reliability, etc.) may be further improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An analog-to-digital conversion apparatus, comprising:
an integrated circuit (IC) configured to generate a first interrupt request; and
an analog-to-digital converter comprised in the integrated circuit,
wherein the analog-to-digital converter is configured to:
receive a plurality of analog values from a plurality of channels, and
convert at least a portion of the received analog values that correspond to at least a portion of channels of the plurality of channels, that are selected based on the first interrupt request into at least a first portion of digital values.

2. The apparatus of claim 1, wherein a correspondence relationship between the first interrupt request and the at least a portion of channels is variable.

3. The apparatus of claim 1, wherein the IC is further configured to generate a second interrupt request,
the analog-to-digital converter is configured to convert at least a portion of analog values corresponding to at least a portion of channels selected based on the second interrupt request among the plurality of channels into at least a second portion of digital values, and
at least a portion of the at least a portion of channels selected based on the second interrupt request are different from the at least a portion of channels selected based on the first interrupt request.

4. The apparatus of claim 3, wherein the analog-to-digital converter is configured to perform a first analog-to-digital conversion operation for the at least a portion of channels selected based on the first interrupt request, and is configured to perform a second analog-to-digital conversion operation for the at least a portion of channels selected based on the second interrupt request in a time division operation.

5. The apparatus of claim 3, further comprising a register comprising a first register configured to store digital values based on a first analog-to-digital conversion operation for the at least a portion of channels selected based on the first interrupt request, and a second register configured to store digital values based on a second analog-to-digital conversion operation for the at least a portion of channels selected based on the second interrupt request.

6. The apparatus of claim 3, wherein the at least a portion of channels selected based on the first interrupt request and the at least a portion of channels selected based on the second interrupt request are partially the same as each other.

7. The apparatus of claim 3, wherein a number of the at least a portion of channels selected based on the first interrupt request and a number of the at least a portion of channels selected based on the second interrupt request are different from each other, and
a time between the first interrupt request and the second interrupt request is different from a time between the second interrupt request and a third interrupt request.

8. The apparatus of claim 3, further comprising a timer configured to generate the first interrupt request by applying a first load value, and configured to generate the second interrupt request by applying a second load value.

9. The apparatus of claim 1, wherein the analog-to-digital converter comprises:
an analog to digital converter (ADC) modulator configured to convert the received analog values into the digital values based on a sampling clock; and
an ADC controller configured to determine whether or not the analog-to-digital converter is in an enable state based on the first interrupt request, and control the ADC modulator based on a change point in time of the enable state.

10. The apparatus of claim 9, wherein the ADC controller is configured to control a conversion timing of the ADC modulator based on a start of conversion (SOC) time having an analog-to-digital conversion period that is based on the first interrupt request, and
the start of conversion (SOC) time is synchronized with the change point in time of the enable state.

11. The apparatus of claim 1, wherein the analog-to-digital converter comprises:
an analog to digital converter (ADC) modulator configured to convert the analog values into the digital values based on a sampling clock; and
an ADC controller configured to control a conversion timing of the ADC modulator based on a start of conversion (SOC) time having an analog-to-digital conversion period based on the first interrupt request.

12. The apparatus of claim 1, wherein the analog-to-digital converter comprises:
an analog to digital converter (ADC) modulator configured to convert the analog values into the digital values based on a sampling clock; and
an ADC controller configured to generate a reset signal per analog-to-digital conversion for each of the at least a portion of channels selected based on the first interrupt request,
wherein a width between a plurality of points in time at which a value is changed in the reset signal is variable based on the at least a portion of channels selected based on the first interrupt request.

13. The apparatus of claim 1, wherein the analog-to-digital converter is configured to store digital values based on analog-to-digital conversion in a register, and generate a data received interrupt request so that one of an external component of the analog-to-digital converter and a driver receives the digital values stored in the register, and
a frequency of the generation of the data received interrupt request is determined based on the at least a portion of channels selected based on the first interrupt request among the plurality of channels.

14. The apparatus of claim 1, wherein the plurality of channels comprise a plurality of Hall sensors.

15. The apparatus of claim 1, further comprising a driver comprised in the IC, and configured to generate a driving signal based on the digital value converted by the analog-to-digital converter,
- wherein the analog-to-digital converter and the driver are configured to be synchronized with each other based on the first interrupt request.

16. A camera device, comprising:
- the IC comprising the analog-to-digital conversion apparatus of claim 1 and configured to generate a driving signal based on the digital values converted by the analog-to-digital converter; and
- a lens module, a position of which is controlled based on the generated driving signal,
- wherein the plurality of channels are configured to generate the plurality of analog values based on the position of the lens module.

\* \* \* \* \*